United States Patent [19]
Ohkawa

[11] Patent Number: 5,763,017
[45] Date of Patent: Jun. 9, 1998

[54] METHOD FOR PRODUCING MICRO-BUBBLE-TEXTURED MATERIAL

[75] Inventor: Tihiro Ohkawa, La Jolla, Calif.

[73] Assignee: Toyo Technologies Inc., La Jolla, Calif.

[21] Appl. No.: 739,495

[22] Filed: Oct. 28, 1996

[51] Int. Cl.$^6$ .................... C23C 14/48; C23C 14/00; B05D 5/00
[52] U.S. Cl. .................... 427/523; 427/526; 427/527; 427/532; 427/533; 427/262; 427/373
[58] Field of Search .................... 427/523, 527, 427/532, 533, 262, 373, 525, 526

[56] References Cited

U.S. PATENT DOCUMENTS

| | | | |
|---|---|---|---|
| 4,001,049 | 1/1977 | Baglin et al. | 148/1.5 |
| 4,466,839 | 8/1984 | Dathe et al. | 148/1.5 |
| 4,474,827 | 10/1984 | Ferralli | 427/38 |
| 4,568,561 | 2/1986 | Betsui et al. | 427/38 |
| 4,780,682 | 10/1988 | Politzer. | |
| 4,915,746 | 4/1990 | Welsch | 148/4 |
| 5,108,982 | 4/1992 | Woolf et al. | |
| 5,225,740 | 7/1993 | Ohkawa. | |
| 5,350,454 | 9/1994 | Ohkawa. | |
| 5,361,016 | 11/1994 | Ohkawa et al. | |
| 5,458,927 | 10/1995 | Malaczynski et al. | 427/527 |
| 5,550,398 | 8/1996 | Kocian et al. | 257/434 |

OTHER PUBLICATIONS

Rauschenbach, "Microbubble formation on glass surfaces," source: Zentralinst. Kernforsch. German report abstract, pp. 181–183, 1978.

*Primary Examiner*—Shrive Beck
*Assistant Examiner*—Michael Barr
*Attorney, Agent, or Firm*—Nydegger & Associates

[57] ABSTRACT

A method for manufacturing a micro-bubble textured material includes performing simultaneous implantation of inert gas atoms and plasma assisted chemical vapor deposition. Plasma that contains ions of an inert gas and neutrals necessary for PCVD is produced over a substrate. The substrate being deposited with the material to be textured is then biased with a negative voltage to accelerate the ions from the plasma. Control over the bias voltage determines the penetration depth into the materials and control over the ion current to the substrate determines the fractional atomic density of the implanted gas atoms and the penetration depth. Simultaneous deposition causes the location of the layer of the implanted atoms to move at the deposition rate, resulting in a uniform implantation of the atoms. A first heating of the substrate enhances the diffusion of the implanted gas atoms to form aggregates and second heating reduces the yield strength of the material and causes the aggregates to expand and to thereby create uniformly distributed micro bubbles in the material.

22 Claims, 1 Drawing Sheet

METHOD FOR PRODUCING MICRO-BUBBLE-TEXTURED MATERIAL

FIELD OF THE INVENTION

The present invention pertains generally to methods for altering the physical characteristics of a material. More specifically, the present invention pertains to a method for creating micro-bubbles in a material using ion implantation together with a plasma assisted chemical vapor deposition process. The present invention is particularly, but not exclusively useful as a method for texturing a technological material with a uniformly dispersed layer of micro-bubbles to predictably alter the electrical, optical or magnetic properties of the material.

BACKGROUND OF THE INVENTION

It is well known that materials or compositions of matter can be altered in many different ways. For example, a material can be altered by subjecting it to variations in temperature and pressure. A material can also be altered by changing its physical dimensions or by texturing the matrix of its structure. Further, a material can be altered by combining it with other compositions of matter. As is well known, such alterations may, and often do, change the physical characteristics of a material.

For a specific example wherein a material is intentionally altered to obtain a particular physical characteristic for the material, consider the texturing of the material by generating air or gas bubbles in the material. On a very familiar level, many bakery products result from such a process. Indeed, baking sodas and baking powders are commonly used to enhance the production of bubbles in baked goods. The purpose, of course, is to give these products a more pleasing texture and make them more edible. Not only bakery products, however, can benefit from the generation of gas bubbles. It happens that the generation of gas bubbles in other materials will result in products which serve a vast number of different purposes. Specifically, as recognized by the present invention, micro-bubbles can be created in a material to improve and enhance the electrical, optical or magnetic characteristics of the material.

In comparison with more familiar mixing procedures, such as are used when following a baking recipe, the procedures and methods envisioned by the present invention are less well known and involve different issues. One such issue arises because the materials to be altered by the present invention are solids, such as glass or silicon. For solids, it is obvious that gas bubbles can not be simply mixed into the material. Consequently, processes such as ion implantation and plasma assisted chemical vapor deposition (PCVD), must be considered.

Ion implantation and PCVD both require the creation of a plasma as a source of ions for ion implantation and as a medium to activate atoms and molecules for PCVD As is well known, a plasma is an ionized gaseous discharge which includes free electrons, charged ions and neutral species which are sometimes referred to simply as neutrals. For PCVD, neutrals from the plasma are deposited directly onto the substrate surface. On the other hand, for ion implantation, it is necessary that the substrate be appropriately biased to accelerate ions from the plasma toward the substrate. Whether the accelerated ions actually penetrate into the substrate is determined by several factors. These include the nature of the substrate (matrix) material that is to be altered, as well as the energy and the mass of the accelerated ions. If implantation occurs, it happens that all

2 ions having the same mass and the same energy will all become implanted in the substrate at substantially the same depth from the substrate surface. It also happens that as the accelerated ions strike the substrate surface and enter the substrate, they acquire electrons and become neutralized. Accordingly, these ions are implanted as atoms. The number of atoms actually implanted into the substrate is then determined by the current of the ions to the substrate and by the duration of the implantation. On the other hand, heavier ions will not penetrate into the substrate. Depending on the choice of gas for deposition, there may be lighter ions such as hydrogen ions present in the plasma. These ions are also implanted. However they are chemically active and may combine with the matrix material after implantation. As a result, the implantation of these ions contributes little in producing the micro-bubbles and the preferred atoms for implantation are those of chemically inert and light gases such as helium.

Because ions of equal mass and equal energy are implanted as gas atoms at substantially the same depth from the substrate surface, a dense layer of gas atoms will be created unless something is done. The downside here is that the dense layer of gas atoms can significantly weaken the substrate, and can lead to flaking and breaking of the substrate. On the other hand, a more uniform distribution of gas atoms through a layer in the substrate material avoids such undesirable consequences and, instead, provides beneficial results. All of this, of course, requires that something is done to create a uniform distribution of gas atoms in the substrate (matrix).

The present invention recognizes that, while the penetration depth of implanted gas atoms in a substrate remains constant, a continuous deposition of a desired material onto the surface of the substrate, by PCVD, will concurrently alter the location of implanted gas atoms in the substrate. Stated differently, a build-up of the substrate resulting from the deposition of neutrals on the surface of the substrate causes a consequent build up in the layer of implanted atoms inside the substrate. Further, the present invention recognizes that ion implantation and PCVD can be accomplished simultaneously to produce a uniform distribution of implanted inert gas atoms in a substrate material. The present invention also recognizes that specific heating processes can be subsequently employed to aggregate the implanted gas atoms and to then form micro-bubbles from the aggregates.

In light of the above, it is an object of the present invention to provide a method for manufacturing a micro-bubble textured material which has modified electrical conducting characteristics that are achieved by reducing the dielectric constant of a dielectric material, such as glass or silica in semiconductor chips, and thereby increasing the speed of electrical signals along conductors near the dielectric material. It is another object of the present invention to provide a method for manufacturing a micro-bubble textured material which creates a uniform layer of micro-bubbles in the material. Still another object of the present invention is to provide a method for manufacturing a micro-bubble textured material which can be used to generate bubbles of variable size in order to achieve particular physical characteristics for the resultant material. Yet another object of the present invention is to provide a method for manufacturing a micro-bubble textured material which is easy to perform, is simple to implement and comparatively cost effective.

SUMMARY OF THE PREFERRED EMBODIMENTS

A method for manufacturing a micro-bubble textured substrate material includes the production of a plasma.

Specifically, the plasma contains positive ions of an inert gas, such as Helium, and neutrals of a gas such as Silicon hydrides and Nitrogen oxides.

To manufacture a micro-bubble textured material in accordance with the present invention, a substrate, such as a silicon wafer, is placed in proximity to the plasma. The substrate is then biased with pulses of negative voltages to accelerate positive ions in the plasma toward the substrate. As these positive gas ions strike the substrate surface, they acquire electrons and are implanted into the substrate as atoms. The actual penetration depth at which the atoms are implanted into the substrate depends on several factors. Namely, the energy and the mass of the particular ions, as well as the nature of the substrate material. For instance, heavier ions may not become implanted. On the other hand, lighter ions of an inert gas, such as helium ions, will penetrate into the substrate material to a depth which is determined by the acceleration voltage.

In accordance with the present invention, as inert gas atoms are implanted into the substrate, neutrals from the plasma are simultaneously deposited onto the substrate's surface. The fact that ion implantation and neutrals deposition are conducted concurrently is important for several reasons. Most importantly, however, this simultaneous process prevents an excessive build-up of gas atoms at the particular penetration depth in the substrate. Instead, due to the build-up of the substrate surface by neutrals from the plasma, the implanted gas atoms are more uniformly distributed through a layer in the substrate. Recall that all positive ions having the same energy and the same mass will penetrate to the same depth into the substrate. Thus, while the penetration depth of the aas atoms into the substrate remains constant, as deposited neutrals raise the surface of the substrate, the layer of implanted gas atoms will be thickened and will be similarly raised along with the surface of the substrate. Accordingly, the location of the inert gas atom layer moves with the deposition of neutrals onto the substrate surface, and at the same speed as this deposition rate.

Depending upon the purposes to be achieved, the material which is deposited onto the substrate can be the same material as the substrate or it can be a different material. When it is desired to create micro-bubbles in only the deposited material, ion implantation can be delayed until after a layer of deposited material is formed on the substrate.

After the gas atoms have been implanted into the substrate, the actual formation of micro-bubbles from the implanted gas atoms is accomplished in a two step thermal treatment. In the first step, aggregates of the implanted atoms are formed by diffusion because the stress of the substrate (matrix) material is decreased by such aggregation. Typically, aggregation is accomplished by heating the substrate to a temperature of around three hundred degrees Centigrade (300° C.). In the second step, the substrate is briefly heated into a range of from three hundred to seven hundred degrees Centigrade (300°–700° C.) to inflate the aggregates into micro-bubbles to a desired size by reducing the yield strength of the substrate (matrix) material. As implied above, the size of the micro-bubbles can be varied and will depend upon the particular physical characteristics desired for the textured material.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
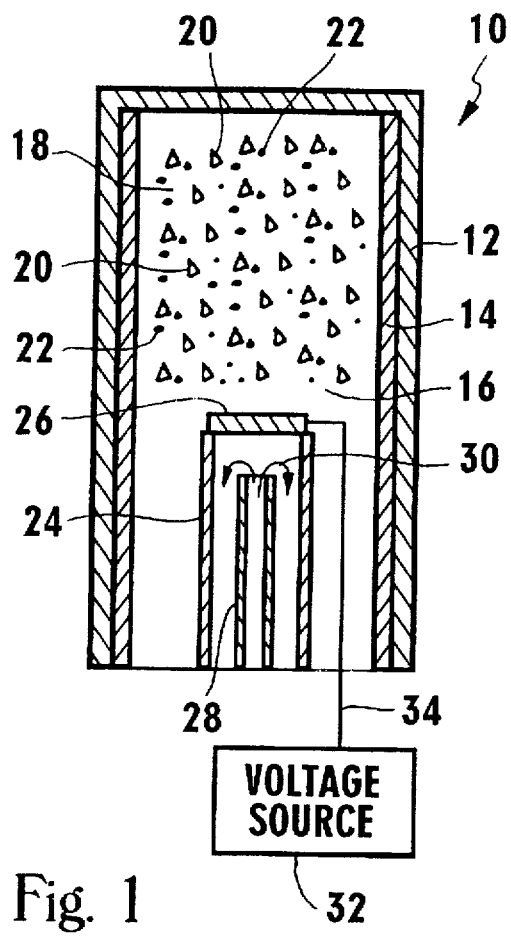
FIG. 1 is a cross-sectional view of a plasma chamber showing the relationship of a plasma to a substrate that is to be altered by the plasma in accordance with the present invention.

Referring initially to FIG. 1, an apparatus for manufacturing a micro-bubble textured material in accordance with the present invention is shown and is generally designated 10. As shown, this apparatus 10 includes a vessel 12 which is lined with an insulator 14. The vessel 12 thus forms a chamber 16 and a plasma 18 can be created in the chamber 16 by using devices and procedures well known in the art. Of particular importance for the present invention, however, is the fact that the plasma 18 contains neutrals 20 of a gas such as Silicon hydrides and Nitrogen oxides, as well as positive ions 22 of an inert gas such as Helium.

FIG. 1 also shows that the apparatus 10 includes a stand 24 which is used to support a substrate 26 and which is positioned in the chamber 16 to expose the substrate 26 to the plasma 18. A pipe 28 is connected in fluid communication with a fluid source (not shown) so that fluid having a selectable temperature can be directed from the source and against the substrate 26, as shown by the arrows 30, to heat the substrate 26 to a desired temperature and maintain the temperature. FIG. 1 also shows that the apparatus 10 includes a voltage source 32 which is electrically connected to the substrate 26 via a line 34 to bias the substrate 26 with negative voltage, as desired by the operator of apparatus 10.

Figure 2A:
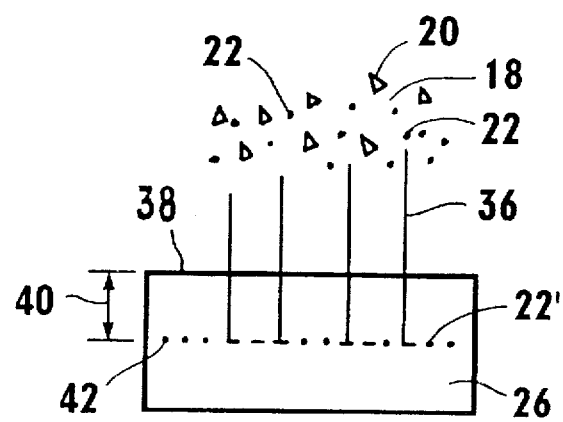
FIG. 2A is a schematic view of a substrate and a plasma with the results of an ion implantation.

FIG. 2A shows an idealized representation of ion implantation in the substrate 26 as intended by the present invention. Specifically, when substrate 26 is biased by a preselected voltage from voltage source 32, positive ions 22 from plasma 18 will be accelerated toward the substrate 26 along paths 36. Depending on the mass of the positive ions 22, and their energy, as the ions 22 bombard the surface 38 of substrate 26 the proceed to a penetration depth 40. Table A below gives values of penetration depths 40 as a function of energy for a specific example wherein the positive ions 22 are helium, and the substrate is taken to be silicon.

TABLE A

| W[kev] | 0.1 | 0.25 | 0.5 | 0.75 | 1.0 | 1.5 | 2.0 |
|---|---|---|---|---|---|---|---|
| d[nm] | 17 | 29 | 43 | 55 | 65 | 83 | 98 |

As the positive ions 22 impact and penetrate into substrate 26, they acquire electrons and become inert gas atoms 22'. Specifically, for the case being considered here wherein the positive ions 22 are helium, the gas atoms 22' will be of helium gas. Because, for any given energy, all of the positive ions 22 will have the same penetration depth 40, a layer 42 of gas atoms 22' is formed in the substrate 26 at the penetration depth 40. During this ion implantation, the substrate 26 is kept near room temperature in order to prevent excessive diffusion of the gas atoms 22' through the material of substrate 26. As indicated above, the concentration of gas atoms 22' at the penetration depth 40 will increase unless the conditions for ion implantation are changed.

Figure 2B:
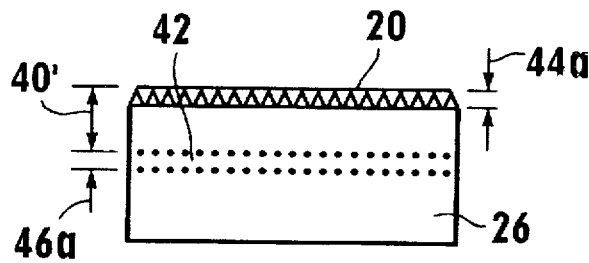
FIG. 2B is a view of the substrate shown in FIG. 2A after additional ion implantation and a depositions of neutrals from a selected material onto the surface of the substrate.

FIG. 2B indicates the situation that develops when neutrals 20 have been deposited onto the surface 38 of substrate 26. For the specific case shown in FIG. 2B, the neutrals have established a deposition depth 44a. This deposition is preferably accomplished by PCVD and, importantly, it causes a changed condition that affects the ion implantation of positive ions 22 in the substrate 26. Specifically, the location of inert gas atoms 22' as they are being implanted into the substrate 26 is changed.

Recall, for ion implantation the penetration depth 40 to which positive ions 22 will proceed from surface 38 into the substrate 26 does not change substantially. Due to a PCVD deposition, however, the deposition depth 44a of neutrals 20 on the surface 38 becomes part of a penetration depth 40'. Thus, because the actual penetration depth does not change, this penetration depth 40' is substantially equal to the penetration depth 40. It should be noted here that in the case where the neutrals 20 are of the same material as the substrate 26, penetration depth 40' will effectively equal penetration depth 40. In cases where the neutrals 20 are of a material that is different from the substrate 26 material, the penetration depth 40' may differ slightly from the penetration depth 40'. In either case, the resultant location of gas atoms 22' in substrate 26 is changed.

The consequence of a change in the location of gas atoms 22' in substrate 26 is that the layer 42 of inert gas atoms 22' attains a thickness 46a. In general, the thickness 46a of layer 42 is equal to the deposition depth 44a of neutrals 20 on the surface 38 of substrate 26. Further, it will be appreciated that the concentration of gas atoms 22' in layer 42 can be effectively controlled by using voltage source 32 and varying the concentration of inert gas in the plasma 18 to vary the current of positive ions 22 to the surface 38. This, however, should be considered in concert with variations in the deposition rate at which neutrals 20 are deposited onto the surface 38 of substrate 26 by a PCVD process. Indeed, the resultant fractional gas atom density in layer 42 depends on both the ion current density of positive ions 22 into the substrate 26 (ion implantation), and the deposition rate of neutrals 20 onto the surface 38 of substrate 26 (PCVD).

Figure 2C:
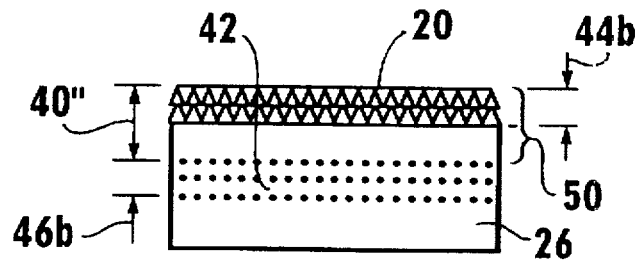
FIG. 2C is a view of the substrate shown in FIG. 2B after yet additional ion implantation and additional deposition.

FIG. 2C shows a further development wherein ion implantation and PCVD deposition have been continued. As shown, a deposition depth 44b is established on the surface 38 and this causes a concomitant change to a thickness 46b for the layer 42. Again, the penetration depth of the positive ions 22 does not change. Penetration depth 40" equals penetration depth 40' equals penetration depth 40, and so on. This process PCVD and ion implantation can, of course, be continued by the operator until a desired thickness 46 is obtained for layer 42. Importantly, as intended by the present invention, ion implantation and PCVD deposition can be accomplished simultaneously.

Once the gas atoms 22' have been implanted into the substrate 26, micro-bubbles 48 can then be created. This is accomplished in a two-phase process. In the first phase, aggregates of the gas atoms 22' are formed. To do this, the gas atoms 22' are heated to a moderate temperature of around three hundred degrees Centigrade (300° C.). This heating increases the diffusion coefficient of the implanted gas atoms 22' and causes them to form aggregates. The formation of aggregates occurs because the stress of the material in (matrix) substrate 26 is decreased by such aggregation. For purposes of the present invention, the heat required for formation of the aggregates, and for the subsequent creation of micro-bubbles in the second phase, can be provided by heated gases which are fed through the pipe 28 and into contact with the substrate 26 while the substrate 26 remains inside the chamber 16 of vessel 12.

As shown below in Table B, and again considering the specific example of helium in silicon, it can be appreciated that there is virtually no diffusion at room temperature (30° C.). For this reason, the ion implantation of gas atoms 22' as previously discussed above is accomplished at or near room temperature. This is done so that the ion implantation will result in a uniform distribution of gas atoms 22' in the layer 42. On the other hand, significant diffusion can be expected above three hundred degrees Centigrade (300° C.). Accordingly, the formation of aggregates in the first phase of the heating process is accomplished at higher, but still somewhat moderate, temperatures.

TABLE B

| T[C] | 30 | 100 | 200 | 300 | 400 | 500 | 600 | 700 |
|---|---|---|---|---|---|---|---|---|
| D[m²/s] | $4.9 \times 10^{-31}$ | $6.3 \times 10^{-26}$ | $2.5 \times 10^{-21}$ | $3.3 \times 10^{-18}$ | $4.6 \times 10^{-16}$ | $1.8 \times 10^{-14}$ | $3.0 \times 10^{-13}$ | $2.7 \times 10^{-12}$ |

In the second phase of the heating process, the aggregates of gas atoms 22' are heated to an elevated temperature that is preferably in a range of from five hundred to six hundred degrees Centigrade (500°–600° C.). With this heating the yield strength of the (matrix) substrate 26 is reduced. Consequently, the aggregates of gas atoms 22' are inflated to form micro-bubbles 48 in the layer 42 of (matrix) substrate 26. The size of the micro-bubbles can, at least to some extent, be controlled by the temperature used and the duration of this heating step.

Figure 3:
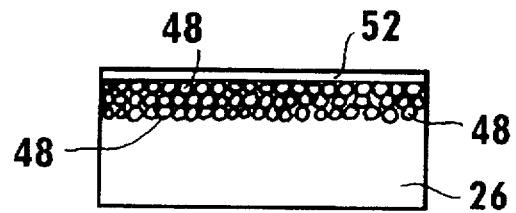
FIG. 3 is an idealized view of the substrate shown in FIGS. 2A-C after additional processing.

As will be appreciated by the skilled artisan, several modifications to the procedures disclosed above are possible. For instance, it may be desirable to have a deposition of neutrals 20 which is of a different material than the material used for substrate 26. This can be done with the present invention. Further, it may be desirable if the layer 42 of gas atoms 22' is created in the deposited neutrals 20, rather than in the substrate 26 itself. This too can be done with the present invention. Also, it may be desirable if the layer 42 of micro-bubbles 48 is exposed. Such a possibility is shown in FIG. 3 wherein a region 50 (shown in FIG. 2C) is removed to expose the underlying layer 42. Additionally, FIG. 3 shows that the exposed layer 42 can be covered by a sealant 52. For purposes of the present invention, the sealant 52 can be of any type known in the pertinent art.

An important application for the present invention is in the manufacture of semiconductor chips. It is known for instance, that the high dielectric constant of the insulating layers which are used for semiconductor chips causes a slow down in the signal speed along the connecting leads. The present invention is useful in this context because it is also known that the formation of micro-bubbles in the insulating layers (e.g. substrate 26) will reduce the dielectric constant. By way of example, Table C shows the relationship between the dielectric constant of a matrix material ($\epsilon$) and the fractional volume of the micro-bubbles (F) for quartz.

TABLE C

| F[%] | 0   | 10  | 20  | 30  | 40  | 50  | 60  | 70  | 80  | 90  |
|------|-----|-----|-----|-----|-----|-----|-----|-----|-----|-----|
| $\epsilon'$ | 4.0 | 3.5 | 3.0 | 2.6 | 2.3 | 2.0 | 1.8 | 1.5 | 1.3 | 1.2 |

While the particular method for manufacturing a micro-bubble textured material as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for manufacturing a micro-bubble textured material, which comprises the steps of:
    producing a plasma, said plasma containing positive ions of an inert gas and neutrals of a selected material;
    depositing said neutrals on a surface of a substrate to build-up said surface with said selected material;
    biasing said substrate to accelerate said positive ions for implantation thereof at a penetration depth from said surface to establish a layer of implanted neutral atoms of said inert gas, said depositing step being accomplished simultaneously with said biasing step to substantially uniformly distribute said implanted ions in at least a portion of said substrate;
    heating said layer to a first temperature to enhance diffusion of said implanted gas atoms in said layer to form gas atom aggregates; and
    heating said gas atom aggregates to a second temperature to expand said gas atoms into micro-bubbles to create a micro-bubble layer.

2. A method as recited in claim 1 wherein said layer is established in said substrate.

3. A method as recited in claim 1 wherein said depositing step and said biasing step are accomplished in concert to establish said layer in said selected material.

4. A method as recited in claim 1 which further comprises the step of removing a portion of said substrate to expose said micro-bubble layer.

5. A method as recited in claim 4 which further comprises the step of sealing said exposed micro-bubble layer.

6. A method as recited in claim 5 wherein said sealing step is accomplished by employing a plasma assisted chemical vapor deposition process.

7. A method as recited in claim 1 which further comprises the step of varying said energy of said positive ions to establish said penetration depth.

8. A method as recited in claim 7 wherein said energy of said positive ions is in a range of from approximately one hundred to approximately two thousand electron volts (0.1–2 kev).

9. A method as recited in claim 7 wherein said penetration depth is established in a range of from approximately ten to approximately one hundred nanometers (10–100 nm).

10. A method as recited in claim 1 wherein said biasing step is accomplished by pulsing said substrate with negative voltage pulses, and said method further comprises the step of controlling said negative voltage pulses to establish a fractional atomic density for said implanted gas atoms in said layer.

11. A method as recited in claim 1 wherein said substrate is maintained at approximately room temperature during said biasing step.

12. A method as recited in claim 1 wherein said first temperature is approximately three hundred degrees Centigrade (300° C.).

13. A method as recited in claim 1 wherein said second temperature is greater than said first temperature.

14. A method for manufacturing a micro-bubble textured material which comprises the steps of:
    creating positive ions of an inert gas and neutrals of a selected material;
    bombarding a substrate with said ions to convert said ions to atoms of said inert gas and to establish a layer of said atoms at a penetration depth in said substrate;
    depositing said neutrals on said substrate to build-up said substrate, said depositing step being accomplished simultaneously with said bombarding step to substantially uniformly distribute said ions according to said build-up; and
    heating said atoms to generate micro-bubbles of said inert gas through said layer.

15. A method as recited in claim 14 further comprising the step of heating said atoms to enhance diffusion of said gas atoms in said layer to form gas atom aggregates.

16. A method as recited in claim 15 wherein said step of heating said atoms to enhance diffusion is accomplished at a first temperature and said step of heating said atoms to generate micro-bubbles is accomplished at a second temperature and wherein said second temperature is higher than said first temperature.

17. A method as recited in claim 16 wherein said substrate is made of silica.

18. A method as recited in claim 14 wherein said inert gas is helium.

19. A method as recited in claim 14 further comprising the step of producing a plasma, said plasma containing said positive ions of an inert gas.

20. A method as recited in claim 14 wherein said positive ions are created to have an energy in a range of from approximately one hundred to approximately two thousand electron volts (0.1–2 kev).

21. A method as recited in claim 14 wherein said penetration depth is in a range of from approximately ten to approximately one hundred nanometers (10–100 nm).

22. A method as recited in claim 14 wherein said bombarding step is accomplished by pulsing said substrate with negative voltage pulses, and said method further comprises the step of controlling said negative voltage pulses to establish a fractional atomic density for said implanted gas atoms in said layer.

* * * * *